(12) United States Patent
Shinkawa et al.

(10) Patent No.: US 9,402,304 B2
(45) Date of Patent: Jul. 26, 2016

(54) CONTROLLING APPARATUS FOR ELECTRIC POWER STEERING APPARATUS

(71) Applicant: NSK Ltd., Shinagawa-ku, Tokyo (JP)

(72) Inventors: Naoto Shinkawa, Tokyo (JP); Shigeru Fukinuki, Tokyo (JP)

(73) Assignee: NSK Ltd., Tokyo (JP)

( * ) Notice: Subject to any disclaimer, the term of this patent is extended or adjusted under 35 U.S.C. 154(b) by 0 days.

(21) Appl. No.: 14/760,900

(22) PCT Filed: Jan. 9, 2014

(86) PCT No.: PCT/JP2014/000059
§ 371 (c)(1),
(2) Date: Jul. 14, 2015

(87) PCT Pub. No.: WO2014/112336
PCT Pub. Date: Jul. 24, 2014

(65) Prior Publication Data
US 2015/0334822 A1   Nov. 19, 2015

(30) Foreign Application Priority Data
Jan. 15, 2013 (JP) .................................. 2013-004673

(51) Int. Cl.
*H05K 1/02* (2006.01)
*H05K 1/11* (2006.01)
(Continued)

(52) U.S. Cl.
CPC ............ *H05K 1/0231* (2013.01); *B62D 5/0406* (2013.01); *H05K 1/0233* (2013.01);
(Continued)

(58) Field of Classification Search
CPC . H05K 1/0231; H05K 1/0233; H05K 1/0298; H05K 1/115; H05K 1/162; H05K 1/141; H05K 1/18; H05K 2201/042; H05K 2201/097; H05K 2201/1006; H01L 2224/4103; B62D 5/0406

USPC .......................................................... 174/260
See application file for complete search history.

(56) References Cited

U.S. PATENT DOCUMENTS 6,160,469 A * 12/2000 Liberatore ............ C04B 35/265
                                                           336/200
6,191,934 B1  2/2001 Liberatore et al.
(Continued)

FOREIGN PATENT DOCUMENTS

JP    51-89153 A    8/1976
JP    5-55721 A     3/1993
(Continued)

OTHER PUBLICATIONS

International Search Report (PCT/ISA/210) dated Feb. 4, 2014 with English-language translation (four (4) pages).
(Continued)

*Primary Examiner* — Timothy Thompson
*Assistant Examiner* — Paul McGee, III
(74) *Attorney, Agent, or Firm* — Crowell & Moring LLP

(57) ABSTRACT

There is provided a printed circuit substrate and a noise suppression structure capable of minimizing constraint on a component layout on a substrate and suppressing noise. The printed circuit substrate includes conductive patterns of odd numbered layers and conductive patterns of even numbered layers which are alternately arranged in a vertical direction and hold an insulating layer between each layer. Portions excepting predetermined areas for connecting a first through-hole and predetermined areas for insulating from a second through-hole in the conductive patterns of the odd numbered layers have a same shape as portions excepting predetermined areas for connecting the second through-hole and predetermined areas for insulating the first through-hole in the conductive patterns of the even numbered layers, and the portions are laminated on one another at the same position in the vertical direction.

4 Claims, 11 Drawing Sheets

(51) Int. Cl.
*H05K 1/16* (2006.01)
*B62D 5/04* (2006.01)
*H05K 1/14* (2006.01)
*H05K 1/18* (2006.01)

(52) U.S. Cl.
CPC .............. *H05K1/0298* (2013.01); *H05K 1/115* (2013.01); *H05K 1/162* (2013.01); *H01L 2224/4103* (2013.01); *H05K 1/141* (2013.01); *H05K 1/18* (2013.01); *H05K 2201/042* (2013.01); *H05K 2201/097* (2013.01); *H05K 2201/1006* (2013.01)

(56) References Cited

U.S. PATENT DOCUMENTS

| | | | | |
|---|---|---|---|---|
| 6,214,445 | B1* | 4/2001 | Kanbe | H01L 23/49822 174/250 |
| 6,333,857 | B1* | 12/2001 | Kanbe | H01L 23/49822 174/262 |
| 2004/0125539 | A1* | 7/2004 | Murakami | H01G 4/30 361/306.1 |

FOREIGN PATENT DOCUMENTS

| | | |
|---|---|---|
| JP | 2000-182886 A | 6/2000 |
| JP | 2000-244129 A | 9/2000 |
| JP | 2001-237507 A | 8/2001 |
| JP | 2004-165631 A | 6/2004 |
| JP | 2012-129271 A | 7/2012 |

OTHER PUBLICATIONS

International Preliminary Report on Patentability (PCT/IPEA/409) dated May 18, 2015 with English-language translation (six (6) pages).

Japanese-language Written Opinion (PCT/ISA/237) dated Feb. 4, 2014 (four (4) pages).

Japanese-language Written Opinion (PCT/ISA/237) dated Mar. 3, 2015 (seven (7) pages).

Reply to Mar. 3, 2015 Written Opinion with English-language translation (eight (8) pages).

* cited by examiner

CONTROLLING APPARATUS FOR ELECTRIC POWER STEERING APPARATUS

TECHNICAL FIELD

The present invention relates to a controlling apparatus for an electric power steering apparatus including a printed circuit substrate for suppressing noise of an electronic apparatus used and a noise suppression structure provided with the printed circuit substrate.

BACKGROUND ART

Recently, a controller area network (CAN) communication of a high speed and large capacity network and an electric power steering apparatus which realizes better steering stability, and function safety has been demanded.

An electronic apparatus in the electric power steering apparatus is strictly demanded to reduce noise to ensure the reliability of signals.

As a conventional noise suppression structure for suppressing noise, for example, the one illustrated in FIG. 14 is known (see PTL 1). FIG. 14 is a perspective view of a conventional example of a noise suppression structure.

A noise suppression structure 201 illustrated in FIG. 14 can change a noise suppression frequency by forming capacitance by two metal surfaces 202 and 203. The noise suppression structure 201 is disposed between a wireless circuit unit (not illustrated) and a digital circuit unit (not illustrated) so as to cut electromagnetic coupling between the wireless circuit unit and the digital circuit unit and prevent noise currents of both sides from flowing to each other.

The noise suppression structure 201 is formed on a ground layer 210 propagating noise, and the first metal surface 202 and the second metal surface 203 are placed on the same plane. A short circuit plate 204 is provided on an end part of the first metal surface 202, and the second metal surface 203 is provided with ground pins 205. The short circuit plate 204 and the ground pins 205 are connected to the ground layer 210.

The first metal surface 202 and the second metal surface 203 both have a comb-shaped pattern formed on a rectangular metal pattern. Each of the metal surfaces 202 and 203 are placed on the same layer and constituted in such a manner that the respective comb parts are arranged alternately so as not to contact with each other. The comb shapes are alternately implemented as described above, and thus a capacitor formed between the comb part of the first metal surface 202 and the comb part of the second metal surface 203 has a zigzag shape along the comb shape. The capacitor makes it possible to change a resonance frequency which enables noise suppression.

CITATION LIST

Patent Literature

PTL 1: JP 2012-129271

SUMMARY OF INVENTION

Technical Problem

However, the conventional noise suppression structure illustrated in FIG. 14 has the following problems.

Specifically, in the case of the noise suppression structure illustrated in FIG. 14, the capacitor is formed between the comb part of the first metal surface 202 and the comb part of the second metal surface 203 and can suppress noise. However, the first metal surface 202 and the second metal surface 203 are both placed on the same plane. Accordingly, areas of the first metal surface 202 and the second metal surface 203 on a plane of the substrate become large to form the capacitor, and a component layout on the substrate is constrained.

Therefore, the present invention has been made to address the above conventional problems, and has an object to provide a printed circuit substrate which can minimize constraint on a component layout on a substrate and suppress noise and a noise suppression structure provided with the printed circuit substrate.

Solution to Problem

In order to solve the problems, according to one aspect of the present invention, there is provided a controlling apparatus for an electric power steering apparatus including a noise suppression structure comprising: a printed circuit substrate including: a multilayer substrate including conductive patterns of odd numbered layers and conductive patterns of even numbered layers alternately arranged in a vertical direction; and insulating layers held between the conductive patterns of the odd numbered layers and the conductive patterns of the even numbered layers, respectively; and a common mode filter connected to the printed circuit substrate, wherein the conductive patterns of the odd numbered layers are connected by a plurality of first through-holes communicating in the vertical direction, and the conductive patterns of the even numbered layers are connected by a plurality of second through-holes communicating in the vertical direction, and wherein each of portions excepting first connecting portions and second connecting portions forming predetermined areas for connecting two of the plurality of first through-holes and predetermined areas for insulating from one of the plurality of second through-holes in the conductive patterns of the odd numbered layers has a same shape as each of portions excepting third connecting portions and fourth connecting portions forming predetermined areas for connecting other two of the plurality of second through-holes and predetermined areas for insulating from another of the plurality of first through-holes in the conductive patterns of the even numbered layers, and the portions are laminated one another at a same position in the vertical direction, and there is no through-hole between the first connecting portions and the second connecting portions in the conductive patterns of the odd numbered layers, and there is no through-hole between the third connecting portions and the fourth connecting portions in the conductive patterns of the even numbered layer, and the common mode filter includes a filter core and two coils wound around the filter core, and an end of one of the two coils is connected to a through-hole connecting a plurality of ground patterns with each other, and the other end of the one of two coils is connected to the another of the plurality of first through-holes, and an end of the other of the two coils is connected to the one of the plurality of second through-holes, and the other end of the other of the two coils is connected to a through-hole connecting a plurality of power supply patterns connected to a power supply with each other.

According to the controlling apparatus for the electric power steering apparatus, a multilayer substrate is constituted in which conductive patterns of odd numbered layers and conductive patterns of even numbered layers are alternately arranged in a vertical direction and hold an insulating layer between each layer. A portion excepting a predetermined area for connecting the first through-hole and a predetermined area for insulating from the second through-hole in the conductive pattern of the odd numbered layer has a same shape as a portion excepting a predetermined area for connecting the second through-hole and a predetermined area for insulating from the first through-hole in the conductive pattern of the even numbered layer, and the portions are laminated at a same position in the vertical direction. Accordingly, the conductive patterns of the odd numbered layers and the conductive patterns of the even numbered layers form a capacitor which can reduce wiring impedance and suppress noise. The conductive patterns of the odd numbered layers and the conductive patterns of the even numbered layers are alternately arranged in the vertical direction and hold the insulating layer between each layer, so that an area of the conductive patterns for forming the capacitor on the plane of the substrate can be small, and the constraint on the component layout on the substrate can be minimized. Further, components can be freely arranged on the substrate by changing places to install the first through-hole and the second through-hole. Furthermore, when wiring widths of the conductive patterns of the odd numbered layers and the conductive patterns of the even numbered layers laminated in the vertical direction are increased, the wiring impedance can be further reduced, and the noise can be further suppressed.

Further, in the controlling apparatus for the electric power steering apparatus, it is preferable that a first land connected to the one of the plurality of second through-holes be provided on one of the predetermined areas in an uppermost layer of the odd numbered layers for insulating from the one of the plurality of second through-holes, and a second land connected to the another of the plurality of first through-holes be provided on one of the predetermined areas in a lowermost layer of the even numbered layers for insulating from the another of the plurality of first through-holes.

According to the controlling apparatus for the electric power steering apparatus, a first land provided on the predetermined area for insulating the second through-hole in the uppermost layer of the odd numbered layers can be connected by solder to a conductor having a predetermined polarity, and a second land provided on the predetermined area for insulating the first through-hole in the lowermost layer of the even numbered layers can be connected by solder to a conductor having an opposite polarity.

Further, in the controlling apparatus for the electric power steering apparatus, the predetermined areas for insulating from the one of the plurality of second through-holes may be notches formed on the conductive patterns of the odd numbered layers, and the predetermined areas for insulating from the another of the plurality of first through-holes may be notches formed on the conductive patterns of the even numbered layers.

Further, in the controlling apparatus for the electric power steering apparatus, the conductive patterns of the odd numbered layers may be connected to a ground line, and the conductive patterns of the even numbered layers may be connected to a power supply line.

Further, a controlling apparatus for an electric power steering apparatus according to another aspect of the present invention can minimize the constraint on the component layout on the substrate and suppress noise.

Advantageous Effects of Invention

According to a controlling apparatus for an electric power steering apparatus of the present invention, a multilayer substrate is constituted in which conductive patterns of odd numbered layers and conductive patterns of even numbered layers are alternately arranged in a vertical direction and hold an insulating layer between each layer. A portion excepting a predetermined area for connecting the first through-hole and a predetermined area for insulating from the second through-hole in the conductive pattern of the odd numbered layer has a same shape as a portion excepting a predetermined area for connecting the second through-hole and a predetermined area for insulating from the first through-hole in the conductive pattern of the even numbered layer, and the portions are laminated at a same position in the vertical direction. Accordingly, the conductive patterns of the odd numbered layers and the conductive patterns of the even numbered layers form a capacitor which can reduce wiring impedance and suppress noise. The conductive patterns of the odd numbered layers and the conductive patterns of the even numbered layers are alternately arranged in the vertical direction and hold the insulating layer between each layer, so that an area of the conductive patterns for forming the capacitor on the plane of the substrate can be small, and the constraint on the component layout on the substrate can be minimized. Further, components can be freely arranged on the substrate by changing places to install the first through-hole and the second through-hole. Furthermore, when wiring widths of the conductive patterns of the odd numbered layers and the conductive patterns of the even numbered layers laminated in the vertical direction are increased, the wiring impedance can be further reduced, and the noise can be further suppressed.

BRIEF DESCRIPTION OF DRAWINGS

FIGS. 7A to 7B are views illustrating the conductive patterns of the plurality of layers in the printed circuit substrate constituting the noise suppression structure illustrated in FIG. 5, wherein, FIG. 7A is a plan view of a conductive pattern of a first layer, FIG. 7B is a plan view of a conductive pattern of a second layer.

DESCRIPTION OF EMBODIMENTS

Figure 1:
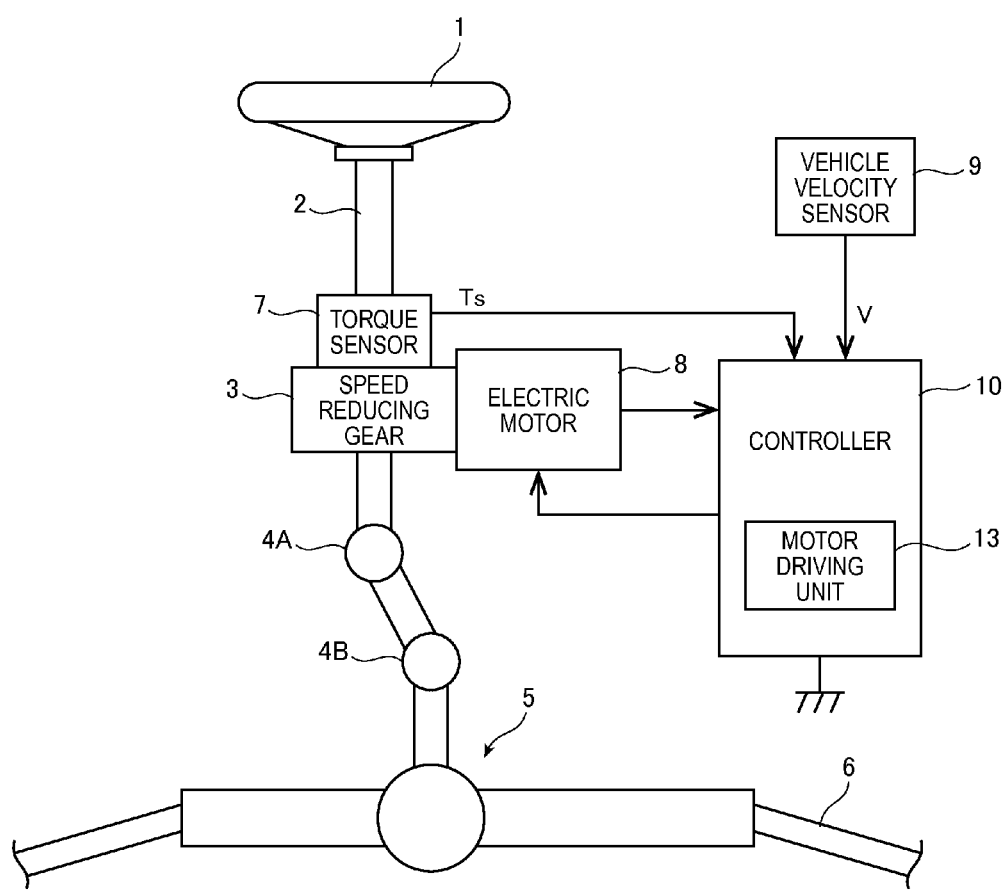
FIG. 1 is a view illustrating a basic structure of an electric power steering apparatus adopting a controlling apparatus for an electric power steering apparatus according to the present invention.
Figure 2:
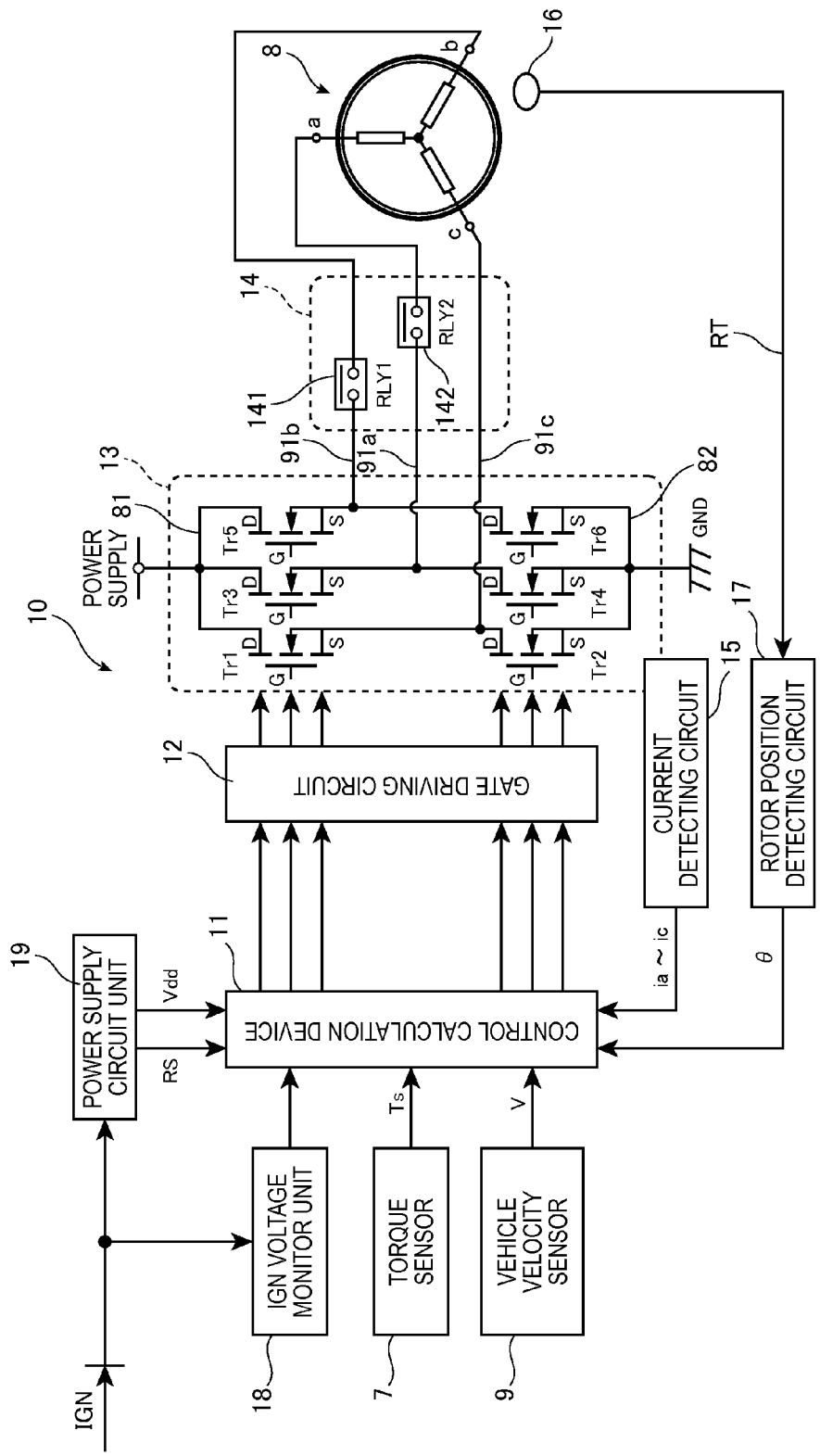
FIG. 2 is a block diagram illustrating a control system of a controller of the electric power steering apparatus illustrated in FIG. 1.
Figure 3:
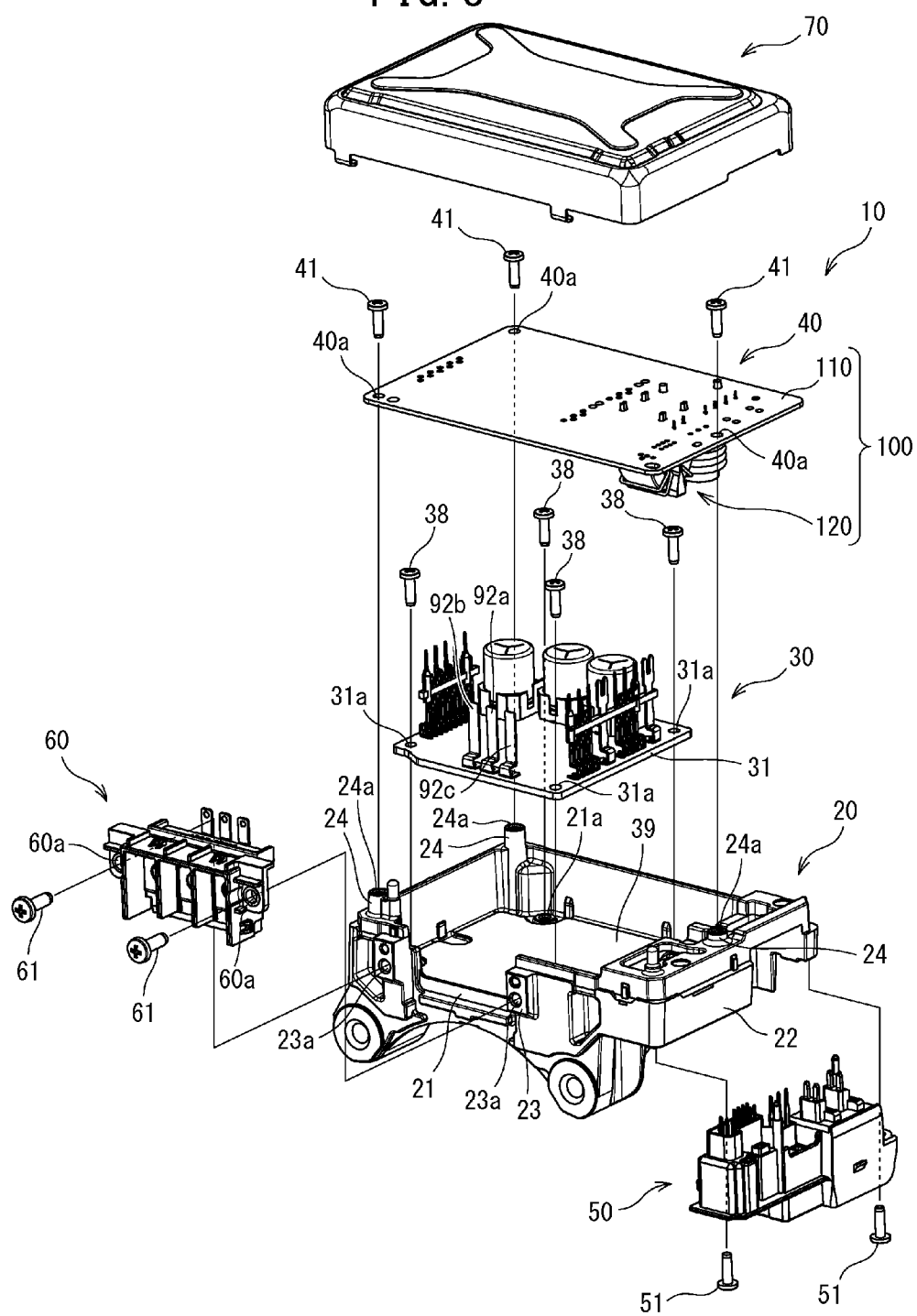
FIG. 3 is an exploded perspective view of the controller including a semiconductor module and the noise suppression structure of the electric power steering apparatus illustrated in FIG. 1.
Figure 4:
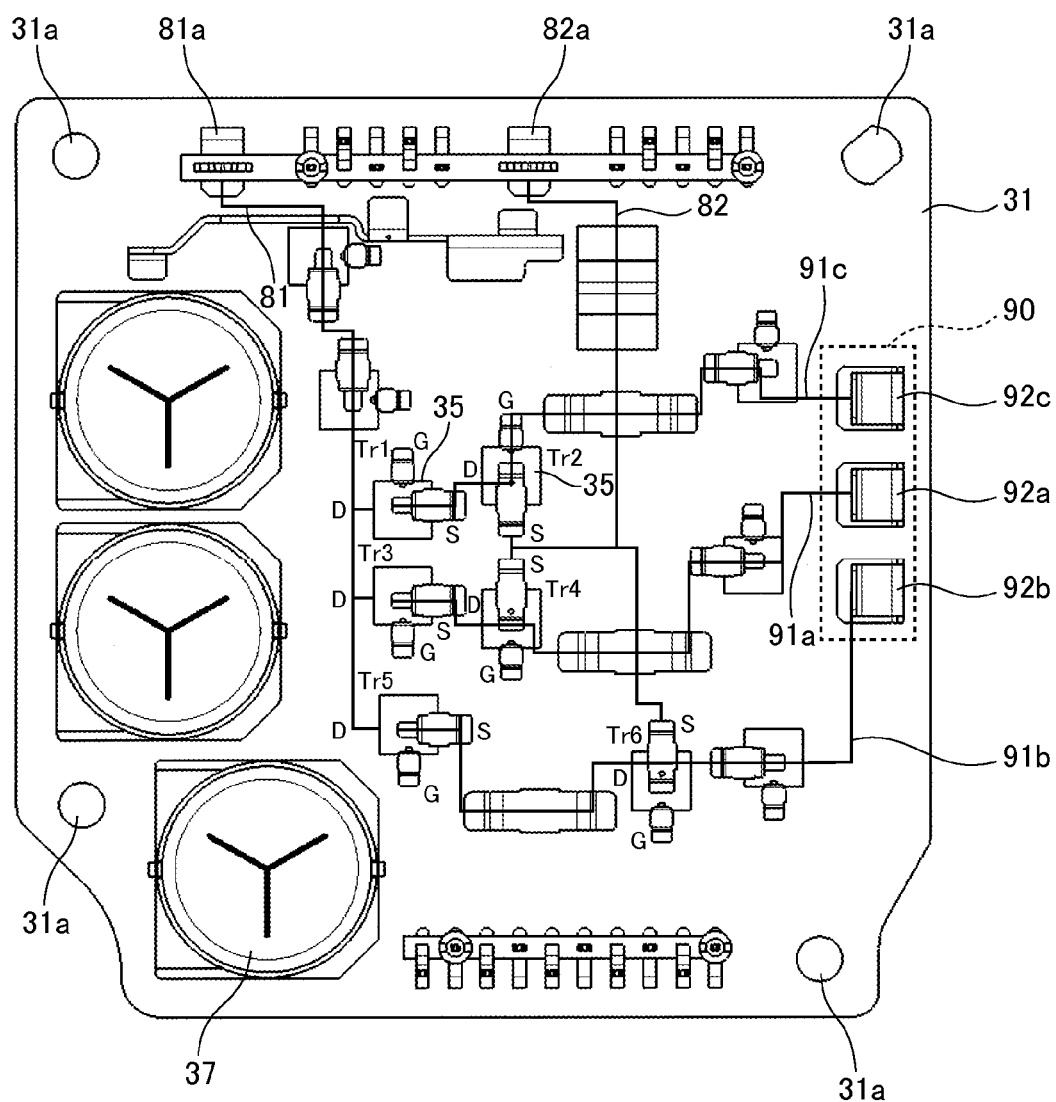
FIG. 4 is a plan view of the semiconductor module illustrated in FIG. 3.

Embodiments of the present invention will now be described with reference to the drawings. FIG. 1 is a view illustrating a basic structure of an electric power steering apparatus adopting a controlling apparatus for an electric power steering apparatus according to the present invention. FIG. 2 is a block diagram illustrating a control system of a controller of the electric power steering apparatus illustrated in FIG. 1. FIG. 3 is an exploded perspective view of the controller including a semiconductor module and the noise suppression structure of the electric power steering apparatus illustrated in FIG. 1. FIG. 4 is a plan view of the semiconductor module illustrated in FIG. 3.

In FIG. 1, a basic structure of the electric power steering apparatus adopting the printed circuit substrate and the noise suppression structure according to the present invention is illustrated. In the electric power steering apparatus, a column shaft 2 of a steering wheel 1 is connected to a tie rod 6 of a wheel to be steered via speed reducing gears 3, universal joints 4A and 4B, and a rack and pinion mechanism 5. The column shaft 2 is provided with a torque sensor 7 for detecting steering torque of the steering wheel 1, and an electric motor 8 for assisting a steering force of the steering wheel 1 is connected to the column shaft 2 via the speed reducing gears 3.

The controller 10 is mainly constituted of a micro computer, and the mechanism and configuration of the controlling apparatus thereof are illustrated in FIG. 2

The steering torque Ts detected by the torque sensor 7 and the vehicle velocity V detected by the vehicle velocity sensor 9 are input to a control calculation device 11 as a control calculation unit, and a current command value calculated by the control calculation device 11 is input to a gate driving circuit 12. A gate driving signal formed by the gate driving circuit 12 based on the current command value and the like is input to a motor driving unit 13 including a bridge configuration of field effect transistors (FETs). The motor driving unit 13 drives the electric motor 8 constituted of a three-phase brushless motor through a breaker device 14 for emergency stop. Each of phase currents of the three-phase brushless motor is detected by a current detecting circuit 15, and the detected three-phase motor currents is to is are input to the control calculation device 11 as feedback currents. The electric motor 8 is equipped with a rotation sensor 16 such as a Hall sensor, a rotation signal RT from the rotation sensor 16 is input to a rotor position detecting circuit 17, and a detected rotation position θ is input to the control calculation device 11.

The ignition signal IGN from the ignition key is input to an ignition voltage monitor unit 18 and a power supply circuit unit 19. Power supply voltage Vdd from the power supply circuit unit 19 is input to the control calculation device 11, and a reset signal Rs for stopping the apparatus is input to the control calculation device 11. The breaker device 14 includes relay contacts 141 and 142 for breaking two phases.

The circuit configuration of the motor driving unit 13 will be described. A serial connection of FETs Tr1 and Tr2, a serial connection of FETs Tr3 and Tr4, and a serial connection of FETs Tr5 and Tr6 are connected to a power-supply line 81, in such a manner that these serial connections are connected in parallel with each another. The serial connection of FETs Tr1 and Tr2, the serial connection of FETs Tr3 and Tr4, and the serial connection of FETs Tr5 and Tr6, which are connected to the power-supply line 81 in parallel with each another, are connected to a ground line 82. Such a configuration constitutes an inverter. In such a configuration, a source electrode S of the FET Tr1 and a drain electrode D of the FET Tr2 are connected in series, and the FETs Tr1 and Tr2 constitute a c-phase arm of the three-phase motor and output a current to a c-phase output line 91c. A source electrode S of the FET Tr3 and a drain electrode D of the FET Tr4 are connected in series, and the FETs Tr3 and Tr4 constitute an a-phase arm of the three-phase motor and output a current to an a-phase output line 91a. A source electrode S of the FET Tr5 and a drain electrode D of the FET Tr6 are connected in series, and the FETs Tr5 and Tr6 constitute a b-phase arm of the three-phase motor and output a current to a b-phase output line 91b.

Next, FIG. 3 is an exploded perspective view of the controller 10 including the semiconductor module and the noise suppression structure of the electric power steering apparatus illustrated in FIG. 1. The controller 10 is provided with: a case 20; the semiconductor module 30 as a power module including the motor driving unit 13; a heat dissipation sheet 39; a control circuit substrate 40 including the control calculation device 11, the gate driving circuit 12, and a noise suppression structure 100; a power/signal connector 50; a three-phase output connector 60; and a cover 70.

The case 20 is formed to have a substantially rectangular shape and provided with a tabular semiconductor module placement portion 21 on which the semiconductor module 30 is placed; a power/signal connector mounting portion 22 arranged on an end part in a length direction of the semiconductor module placement portion 21, on which the power/signal connector 50 is mounted; and a three-phase output connector mounting portion 23 arranged on an end part in a width direction of the semiconductor module placement portion 21, on which the three-phase output connector 60 is mounted.

A plurality of screw holes 21a are formed on the semiconductor module placement portion 21, and an attachment screw 38 for attaching the semiconductor module 30 is screwed into the screw hole 21a. The semiconductor module placement portion 21 and the power/signal connector mounting portion 22 are provided with a plurality of attaching posts 24 vertically standing for attaching the control circuit substrate 40. A screw hole 24a is formed on the attaching post 24, and an attachment screw 41 for attaching the control circuit substrate 40 is screwed into the screw hole 24a. Further, a plurality of screw holes 23a are formed on the three-phase output connector mounting portion 23, and an attachment screw 61 for attaching the three-phase output connector 60 is screwed into the screw hole 23a.

The semiconductor module 30 includes a circuit configuration of the above-described motor driving unit 13. As illustrated in FIG. 4, the six FETs Tr1 to Tr6 constituted of bare-chip FETs 35, a positive electrode terminal 81a connected to the power-supply line 81, and a negative electrode terminal 82a connected to the ground line 82 are mounted on a substrate 31. In addition, a three-phase output portion 90 including an a-phase output terminal 92a connected to the a-phase output line 91a, a b-phase output terminal 92b connected to the b-phase output line 91b, and a c-phase output terminal 92c connected to the c-phase output line 91c are mounted on the substrate 31. Other surface mounting devices 37 including a capacitor are also mounted on the substrate 31. Further, a plurality of through-holes 31a are formed on the substrate 31 of the semiconductor module 30, and an attachment screw 38 for attaching the semiconductor module 30 is inserted into the through-hole 31a.

When the semiconductor module 30 is attached on the semiconductor module placement portion 21, the heat dissipation sheet 39 is attached on the semiconductor module placement portion 21, and the semiconductor module 30 is attached to the heat dissipation sheet 39 from above. By use of the heat dissipation sheet 39, the heat generated in the semiconductor module 30 is dissipated to the case 20 through the heat dissipation sheet 39.

A control circuit including the control calculation device 11 and the gate driving circuit 12 is configured by mounting a plurality of electronic components on the printed circuit substrate 110 of the control circuit substrate 40.

As illustrated in FIG. 3, the noise suppression structure 100 is made of the printed circuit substrate 110 of the control circuit substrate 40 and a common mode filter 120 mounted on the printed circuit substrate 110. The noise suppression structure 100 suppresses noise from the electronic apparatus in the electric power steering apparatus by the common mode filter 120 and also suppresses the noise by the printed circuit substrate 110 so as to reduce the noise of the electronic apparatus.

Figure 5:
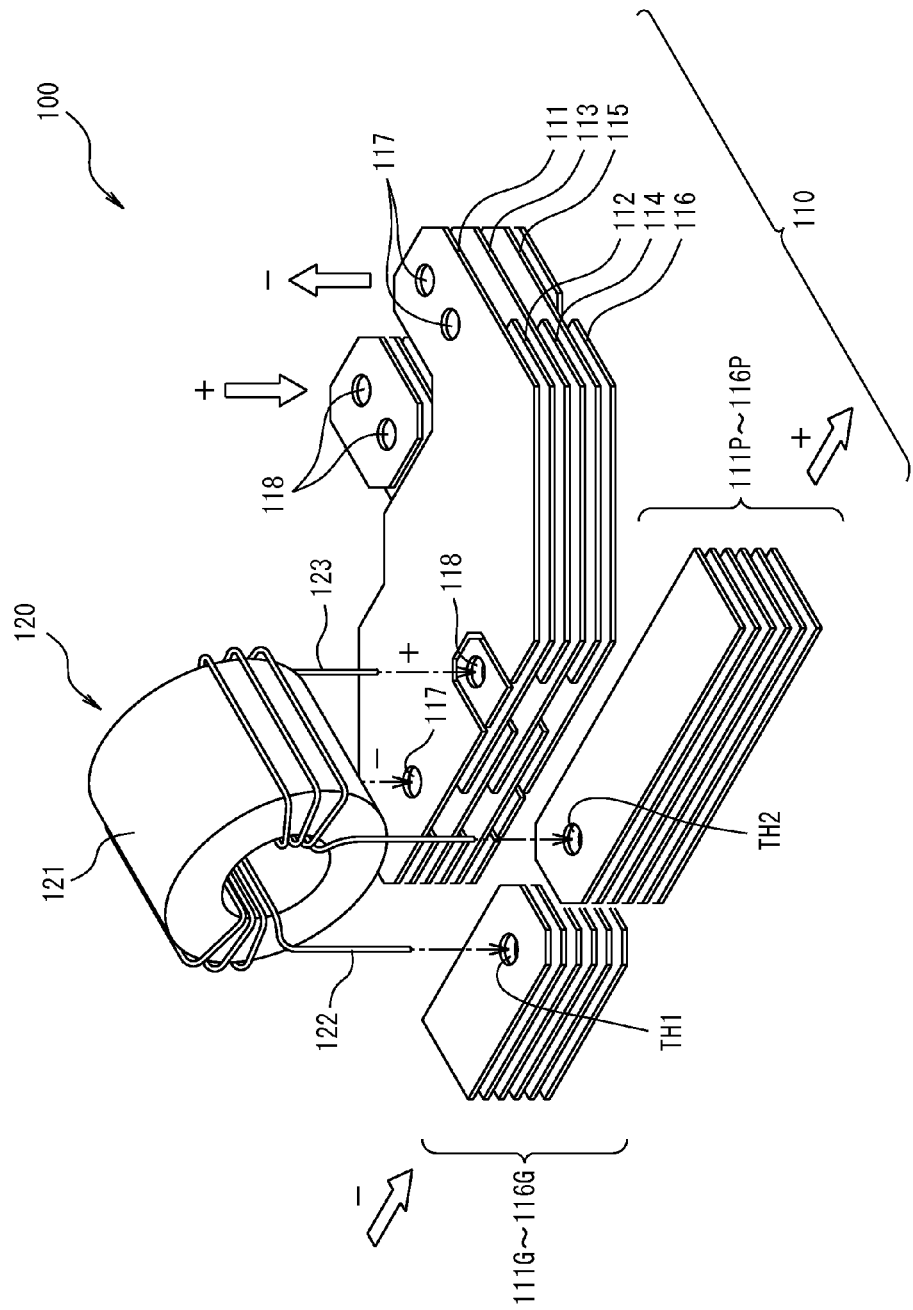
FIG. 5 is a perspective view illustrating a schematic configuration of the noise suppression structure, wherein only conductive patterns of a plurality of layers are illustrated in the printed circuit substrate constituting the noise suppression structure.
Figure 6:
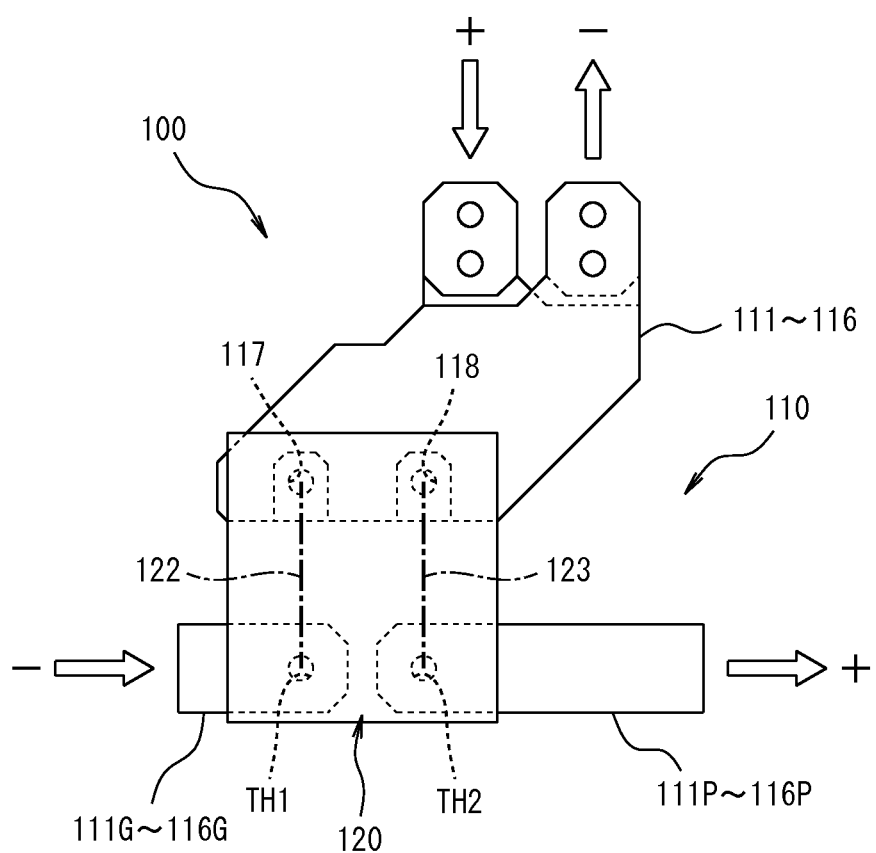
FIG. 6 is a plan view of the noise suppression structure illustrated in FIG. 5.
Figure 7A:
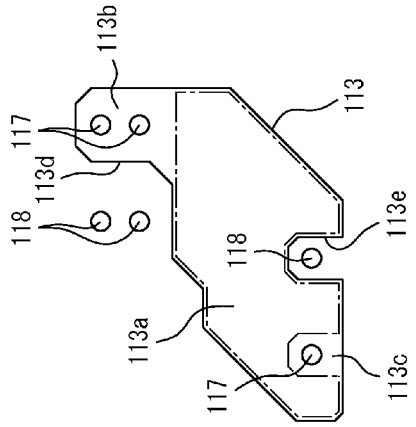
Figure 7B:
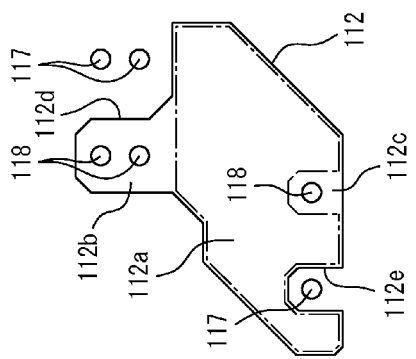
Figure 7C:
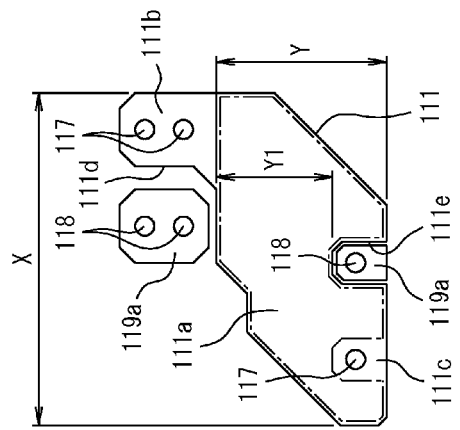
FIG. 7C is a plan view of a conductive pattern of a third layer.
Figure 7D:
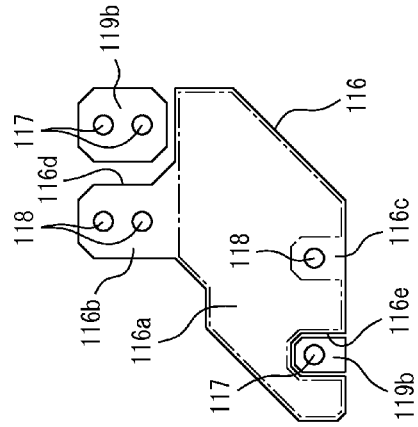
FIG. 7D is a plan view of a conductive pattern of a fourth layer.
Figure 7E:
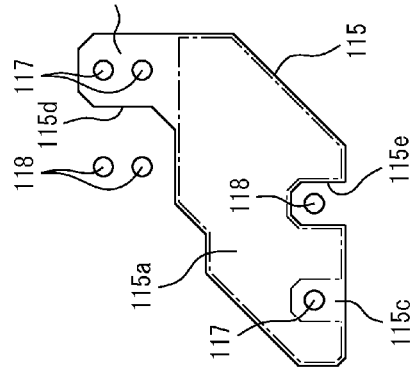
FIG. 7E is a plan view of a conductive pattern of a fifth layer.
Figure 7F:
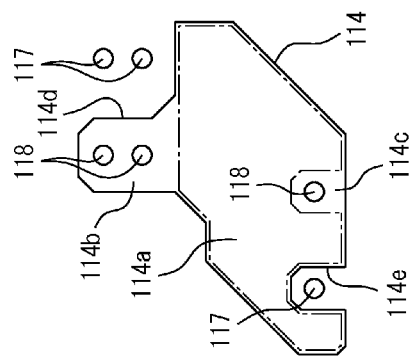
FIG. 7F is a plan view of a conductive pattern of a sixth layer.
Figure 8:
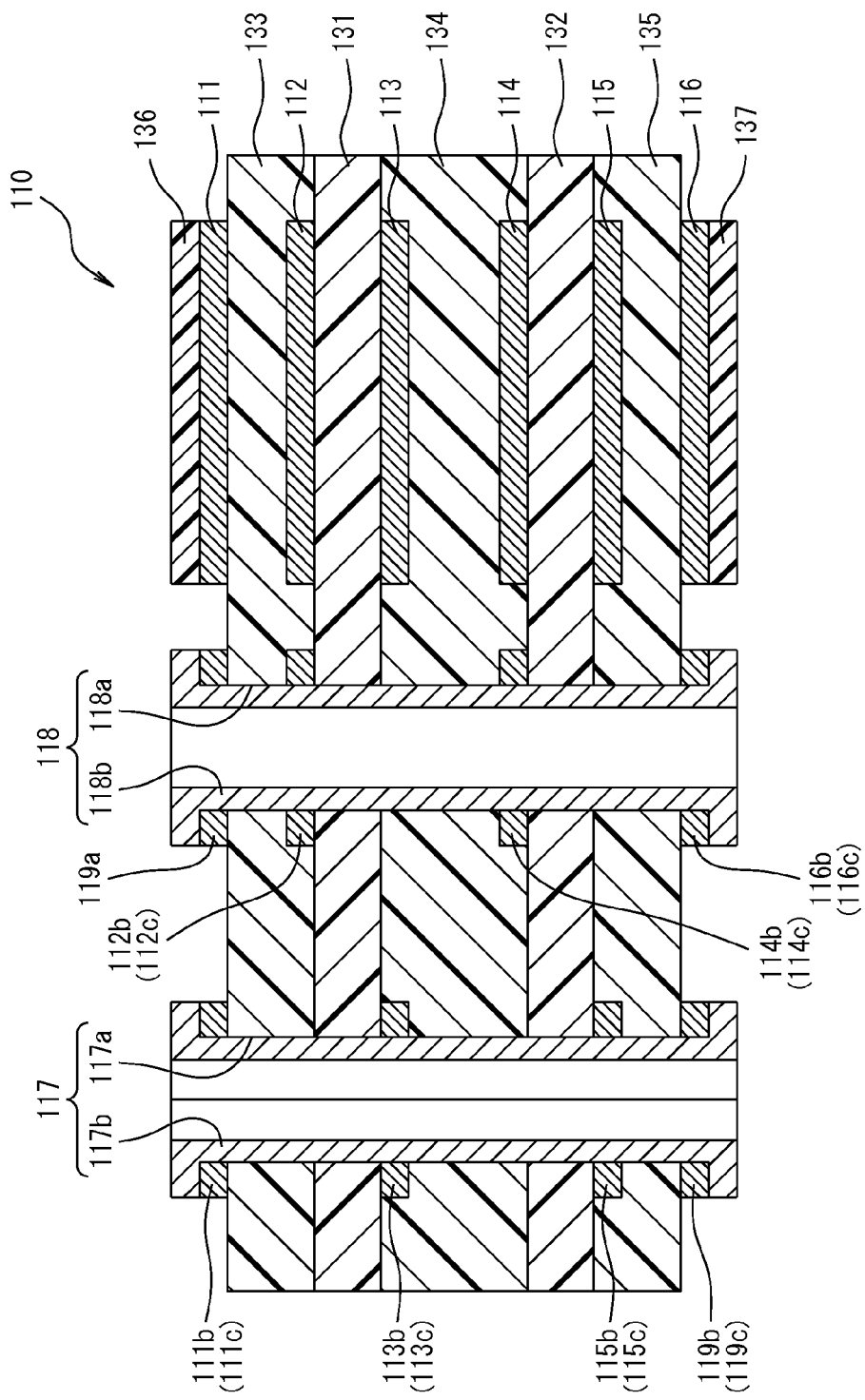
FIG. 8 is a cross-sectional schematic view of the printed circuit substrate constituting the noise suppression structure illustrated in FIG. 5.

FIG. 5 is a perspective view illustrating a schematic configuration of the noise suppression structure. FIG. 6 is a plan view of the noise suppression structure illustrated in FIG. 5. FIGS. 7A to 7F are views illustrating the conductive patterns of the plurality of layers in the printed circuit substrate constituting the noise suppression structure illustrated in FIG. 5. FIG. 7A is a plan view of a conductive pattern of a first layer. FIG. 7B is a plan view of a conductive pattern of a second layer. FIG. 7C is a plan view of a conductive pattern of a third layer. FIG. 7D is a plan view of a conductive pattern of a fourth layer. FIG. 7E is a plan view of a conductive pattern of a fifth layer. FIG. 7F is a plan view of a conductive pattern of a sixth layer; FIG. 8 is a cross-sectional schematic view of the printed circuit substrate constituting the noise suppression structure illustrated in FIG. 5.

In FIG. 5, the noise suppression structure 100 includes the printed circuit substrate 110 (only the conductive patterns of a plurality of layers are illustrated) and the common mode filter 120 mounted on the printed circuit substrate 110.

As illustrated in FIG. 5 and FIG. 8, the printed circuit substrate 110 is constituted of a six-layer substrate including a conductive pattern 111 of a first layer to a conductive pattern 116 of a sixth layer. As illustrated in FIG. 8, the printed circuit substrate 110 is provided with a tabular insulation first substrate material 131 and a tabular insulation second substrate material 132 disposed below the first substrate material 131. A first prepreg 133, which is an insulating layer, is disposed above the first substrate material 131. A second prepreg 134, which is an insulating layer, is disposed below the first substrate material 131 and between the first substrate material 131 and the second substrate material 132. A third prepreg 135 is disposed below the second substrate material 132.

The conductive pattern 111 of the first layer is disposed on an upper surface of the first prepreg 133. A conductive pattern 112 of a second layer is disposed on an upper surface of the first substrate material 131. A conductive pattern 113 of a third layer is disposed on a lower surface of the first substrate material 131. A conductive pattern 114 of a fourth layer is disposed on an upper surface of the second substrate material 132. A conductive pattern 115 of a fifth layer is disposed on a lower surface of the second substrate material 132. The conductive pattern 116 of the sixth layer is disposed on a lower surface of the third prepreg 135. Accordingly, the conductive patterns 111, 113, and 115 of the odd numbered layers (first, third, and fifth layers) and the conductive patterns 112, 114, and 116 of the even numbered layers (second, fourth, and sixth layers) are alternately arranged in the vertical direction in such a manner that the prepreg (insulating layer) 133, the first substrate material (insulating layer) 131, the second prepreg (insulating layer) 134, the second substrate material (insulating layer) 132, and the third prepreg (insulating layer) 135 are held between each layer.

The conductive patterns 111, 113, and 115 of the odd numbered layers are ground patterns and connected to a ground line. The conductive patterns 112, 114, and 116 of the even numbered layers are power supply patterns and connected to a power supply line.

As illustrated in FIG. 6 to FIG. 8, the conductive patterns 111, 113, and 115 of the odd numbered layers are mutually connected by a plurality of first through-holes 117 communicating in the vertical direction. Further, the conductive patterns 112, 114, and 116 of the even numbered layers are mutually connected by a plurality of second through-holes 118 communicating in the vertical direction. Each first through-hole 117 is constituted of a through-hole 117a piercing through an upper surface and a lower surface of the printed circuit substrate 110 and a conductive portion 117b connecting between the upper surface and the lower surface of the printed circuit substrate 110 by annularly extending in an inner circumferential surface of the through-hole 117a in the vertical direction. Each second through-hole 118 is constituted of a through-hole 118a piercing through the upper surface and the lower surface of the printed circuit substrate 110 and a conductive portion 118b connecting between the upper surface and the lower surface of the printed circuit substrate 110 by annularly extending in an inner circumferential surface of the through-hole 118a in the vertical direction.

Next, configurations of the conductive patterns 111 to 116 of the first layer to the six-layer are described with reference to FIGS. 7A to 7B.

First, as illustrated in FIG. 7A, the conductive pattern 111 of the first layer includes a pattern main body 111a having an approximately parallelogram shape in the center, and a first connecting portion 111b forming an area for connecting the first through-hole 117 protrudes from an upper right end part of the pattern main body 111a. On a left side of the first connecting portion 111b, a first notch 111d is formed for forming an area for insulating from the second through-hole 118. In addition, a second connecting portion 111c forming an area for connecting the first through-hole 117 and a second notch 111e forming an area for insulating from the second through-hole 118 are formed on a lower internal side of the pattern main body 111a.

The first notch 111d of the first layer is provided with a first land 119a connected to the second through-hole 118 connected to the conductive patterns 112, 114, and 116 of the even numbered layers which are opposite layers to the conductive pattern 111 of the first layer. The second notch 111e of the first layer is also provided with the first land 119a connected to the second through-hole 118 connected to the conductive patterns 112, 114, and 116 of the even numbered layers which are opposite layers to the conductive pattern 111 of the first layer.

As illustrated in FIG. 7B, the conductive pattern 112 of the second layer includes a pattern main body 112a having an approximately parallelogram shape in the center, and a first connecting portion 112b forming an area for connecting the second through-hole 118 protrudes from an upper left end part of the pattern main body 112a. On a right side of the first connecting portion 112b, a first notch 112d is formed for forming an area for insulating from the first through-hole 117. In addition, a second connecting portion 112c forming an area for connecting the second through-hole 118 and a second notch 112e forming an area for insulating from the first through-hole 117 are formed on a lower internal side of the pattern main body 112a.

The conductive pattern 113 of the third layer has a same shape as the conductive pattern 111 of the first layer. As illustrated in FIG. 7C, the conductive pattern 113 of the third layer includes a pattern main body 113a having an approximately parallelogram shape in the center, and a first connecting portion 113b forming an area for connecting the first through-hole 117 protrudes from an upper right end part of the pattern main body 113a. On a left side of the first connecting portion 113b, a first notch 113d is formed for forming an area for insulating from the second through-hole 118. In addition, a second connecting portion 113c forming an area for connecting the first through-hole 117 and a second notch 113e forming an area for insulating from the second through-hole 118 are formed on a lower internal side of the pattern main body 113a.

Further, the conductive pattern 114 of the fourth layer has a same shape as the conductive pattern 112 of the second layer. As illustrated in FIG. 7D, the conductive pattern 114 of the fourth layer includes a pattern main body 114a having an approximately parallelogram shape in the center, and a first connecting portion 114b forming an area for connecting the second through-hole 118 protrudes from an upper left end part of the pattern main body 114a. On a right side of the first connecting portion 114b, a first notch 114d is formed for forming an area for insulating from the first through-hole 117. In addition, a second connecting portion 114c forming an area for connecting the second through-hole 118 and a second notch 114e forming an area for insulating from the first through-hole 117 are formed on a lower internal side of the pattern main body 114a.

Further, the conductive pattern 115 of the fifth layer has a same shape as the conductive patterns 111 and 113 of the first and third layers. As illustrated in FIG. 7E, the conductive pattern 115 of the fifth layer includes a pattern main body 115a having an approximately parallelogram shape in the center, and a first connecting portion 115b forming an area for connecting the first through-hole 117 protrudes from an upper right end part of the pattern main body 115a. On a left side of the first connecting portion 115b, a first notch 115d is formed for forming an area for insulating from the second through-hole 118. In addition, a second connecting portion 115c forming an area for connecting the first through-hole 117 and a second notch 115e forming an area for insulating from the second through-hole 118 are formed on a lower internal side of the pattern main body 115a.

Further, the conductive pattern 116 of the sixth layer has a same shape as the conductive patterns 112 and 114 of the second and fourth layers. As illustrated in FIG. 7F, the conductive pattern 116 of the sixth layer includes a pattern main body 116a having an approximately parallelogram shape in the center, and a first connecting portion 116b forming an area for connecting the second through-hole 118 protrudes from an upper left end part of the pattern main body 116a. On a right side of the first connecting portion 116b, a first notch 116d is formed for forming an area for insulating from the first through-hole 117. In addition, a second connecting portion 116c forming an area for connecting the second through-hole 118 and a second notch 116e forming an area for insulating from the first through-hole 117 are formed on a lower internal side of the pattern main body 116a.

The first notch 116d of the sixth layer is provided with a second land 119b connected to the first through-hole 117 connected to the conductive patterns 111, 113, and 115 of the odd numbered layers which are opposite layers to the conductive pattern 116 of the sixth layer. The second notch 116e of the sixth layer is also provided with the second land 119b connected to the first through-hole 117 connected to the conductive patterns 111, 113, and 115 of the odd numbered layers which are opposite layers to the conductive pattern 116 of the sixth layer.

In the conductive patterns 111 to 116 of the first layer to the sixth layer formed as described above, portions excepting the first connecting portions 111b, 113b, and 115b and the second connecting portions 111c, 113c, and 115c which form predetermined areas for connecting the first through-hole 117 and the first notches 111d, 113d, and 115d and the second notches 111e, 113e, and 115e which form predetermined areas for insulating from the second through-hole 118 in the conductive patterns 111, 113, and 115 of the odd numbered layers (portions surrounded by alternate long and short dash lines in FIGS. 7A, 7C, and 7E) have same shapes as portions excepting the first connecting portions 112b, 114b, and 116b and the second connecting portions 112c, 114c, and 116c which form predetermined areas for connecting the second through-hole 118 and the first notches 112d, 114d, and 116d and the second notches 112e, 114e, and 116e which form predetermined areas for insulating from the first through-hole 117 in the conductive patterns 112, 114, and 116 of the even numbered layers (portions surrounded by alternate long and short dash lines in FIGS. 7B, 7D, and 7F), and the portions are laminated on one another at the same position in the vertical direction.

As illustrated in FIG. 5 and FIG. 6, the printed circuit substrate 110 includes conductive patterns 111G to 116G of the first layer to the sixth layer different from the above-described conductive patterns 111 to 116 which are arranged a predetermined distance away from the conductive patterns 111 to 116 in a plan view. The conductive patterns 111G to 116G of the first layer to the sixth layer are formed to extend in a lateral direction as illustrated in FIG. 6. The conductive pattern 111G of the first layer is disposed on the upper surface of the first prepreg 133, the conductive pattern 112G of the second layer is disposed on the upper surface of the first substrate material 131, the conductive pattern 113G of the third layer is disposed on the lower surface of the first substrate material 131, the conductive pattern 114G of the fourth layer is disposed on the upper surface of the second substrate material 132, the conductive pattern 115G of the fifth layer is disposed on the lower surface of the second substrate material 132, and the conductive pattern 116G of the sixth layer is disposed on the lower surface of the third prepreg 135, which are not illustrated. The conductive patterns 111G to 116G of the first layer to the sixth layer are mutually connected by a plurality of through-holes TH1 communicating in the vertical direction as illustrated in FIG. 6. Further, the conductive patterns 111G to 116G of the first layer to the sixth layer are the ground patterns and connected to the ground line.

Further, as illustrated in FIG. 5, the printed circuit substrate 110 includes conductive patterns 111P to 116P of the first layer to the sixth layer different from the above-described conductive patterns 111 to 116 which are arranged a predetermined distance away from the conductive patterns 111 to 116 to face the conductive patterns 111G to 116G in the lateral direction in a plan view. The conductive patterns 111P to 116P of the first layer to the sixth layer are formed to extend in the lateral direction as illustrated in FIG. 6. The conductive pattern 111P of the first layer is disposed on the upper surface of the first prepreg 133, the conductive pattern 112P of the second layer is disposed on the upper surface of the first substrate material 131, the conductive pattern 113P of the third layer is disposed on the lower surface of the first substrate material 131, the conductive pattern 114P of the fourth layer is disposed on the upper surface of the second substrate material 132, the conductive pattern 115P of the fifth layer is disposed on the lower surface of the second substrate material 132, and the conductive pattern 116P of the sixth layer is disposed on the lower surface of the third prepreg 135, which are not illustrated. The conductive patterns 111P to 116P of the first layer to the sixth layer are mutually connected by a plurality of through-holes TH2 communicating in the vertical direction as illustrated in FIG. 6. Further, the conductive patterns 111P to 116P of the first layer to the sixth layer are the power supply patterns and connected to the power supply line.

The above-described conductive patterns 111 to 116, 111G to 111G, and 111P to 116P of the first layer to the sixth layer are all copper conductors. The conductive patterns 111, 111G, and 111P of the first layer are each about 0.018 mm in thickness, the conductive patterns 112, 112G, and 112P of the second layer are each about 0.035 mm in thickness, the conductive patterns 113, 113G, and 113P of the third layer are each about 0.035 mm in thickness, the conductive patterns 114, 114G, and 114P of the fourth layer are each about 0.035 mm in thickness, the conductive patterns 115, 115G, and 115P of the fifth layer are each about 0.035 mm in thickness, and the conductive patterns 116, 116G, and 116P of the sixth layer are each about 0.018 mm in thickness. Further, the first substrate material 131 and the second substrate material are each about 0.2 mm in thickness. In addition, the first prepreg 133 is about 0.2 mm in thickness, the second prepreg 134 is about 0.4 mm in thickness, and the third prepreg 135 is about 0.2 mm in thickness. As illustrated in FIG. 8, a solder resist 136 is formed on an upper surface of the conductive pattern 111 of the first layer, a solder resist is also formed on a lower surface of the conductive pattern 116 of the sixth layer, and an overall thickness of the printed circuit substrate 110 including the solder resists 136 and 137 is about 1.4 mm.

As illustrated in FIG. 5, the common mode filter 120 is provided with a filter core 121 and two coils 122 and 123 wound around the filter core 121. As illustrated in FIG. 6, an end of the coil 122 is connected to the through-hole TH1 connecting the conductive patterns 111G to 116G of the first layer to the sixth layer with each other, and the other end of the coil 122 is connected to the through-hole TH2 connecting the conductive patterns 111P to 116P of the first layer to the sixth layer with each other. In addition, an end of the other coil 123 is connected to the second through-hole 118 connecting the conductive patterns 112, 114, and 116 of the even numbered layers with each other, and the other end of the other coil 123 is connected to the first through-hole 117 connecting the conductive patterns 111, 113, and 115 of the odd numbered layers with each other.

In FIG. 6, the through-hole TH2 and the second through-hole 118 connected to the power supply line are arranged straight in the vertical direction in FIG. 5, and the through-hole TH1 and the first through-hole 117 connected to the ground line are arranged straight. However, the through-hole TH2 and the second through-hole 118 connected to the power supply line may be arranged crosswise, and the through-hole TH1 and the first through-hole 117 connected to the ground line may be arranged crosswise by exchanging the positions of the first through-hole 117 and the second through-hole 118.

After the semiconductor module 30 is attached on the semiconductor module placement portion 21, the control circuit substrate 40 including the thus configured noise suppression structure 110 is attached above the semiconductor module 30 and on the plurality of attaching posts 24 vertically standing on the semiconductor module placement portion 21 and the power/signal connector mounting portion 22 with the plurality of attachment screws 41 as illustrated in FIG. 3. A plurality of through-holes 40a are formed on the printed circuit substrate 110 of the control circuit substrate 40, and the attachment screw 41 is inserted into the through-hole 40a.

The power/signal connector 50 is used to supply direct-current power from a battery (not illustrated) to the semiconductor module 30 and to input various signals including signals from the torque sensor 12 and the vehicle velocity sensor 9 to the control circuit substrate 40. The power/signal connector 50 is attached on the power/signal connector mounting portion 22 provided on the semiconductor module placement portion 21 with a plurality of attachment screws 51 as illustrated in FIG. 3.

The three-phase output connector 60 is used to output currents from the a-phase output terminal 92a, the b-phase output terminal 92b, and the c-phase output terminal 92c. The three-phase output connector 60 is attached on the three-phase output connector mounting portion 23 provided on the end part in a width direction of the semiconductor module placement portion 21 with a plurality of attachment screws 61 as illustrated in FIG. 3. A plurality of through-holes 60a are formed on the three-phase output connector 60, and the attachment screw 61 is inserted into the through-hole 60a.

The cover 70 is attached on the case 20 to which the semiconductor module 30, the control circuit substrate 40, the power/signal connector 50, and the three-phase output connector 60 are attached, in such a manner that the cover 70 covers the control circuit substrate 40 from above as illustrated in FIG. 3.

Next, a relationship between a wiring area and a capacitance of a capacitor generated by alternately laminating wirings is described with reference to FIG. 9.

A capacitor is generated by alternately laminating wirings. In this regard, the capacitance of the capacitor is determined by a following formula (1).

[Math. 1]

$$C = k \frac{\varepsilon_r A}{d} \times (n-1) \quad (1)$$

In the formula (1), C is a capacitance value of a capacitor, k is a transform coefficient, $\varepsilon_r$ is permittivity of a substrate material, A is an area of wirings alternately laminated, d is a distance between layers, and n is the number of layers.

Figure 9:
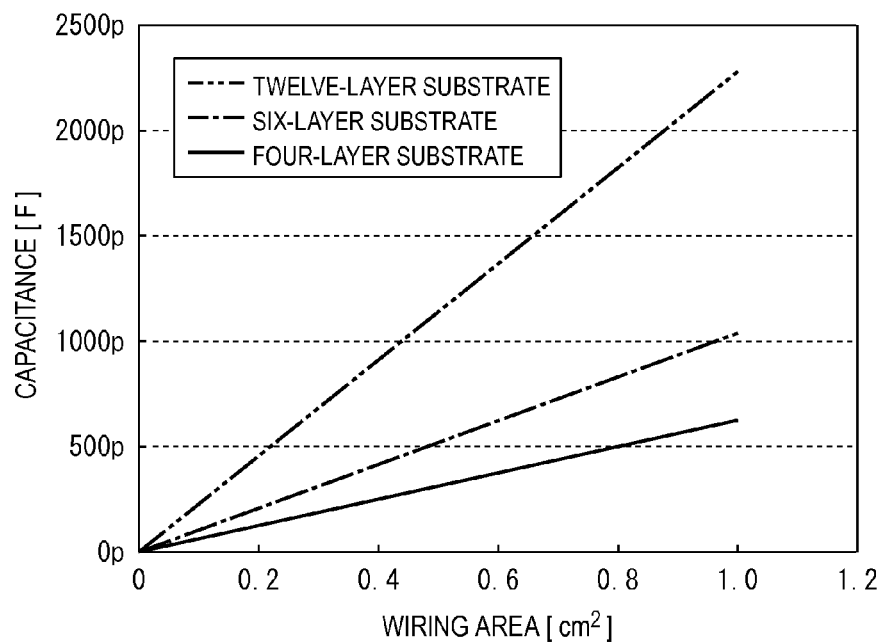
FIG. 9 is a graph illustrating a relationship between a wiring area and a capacitance of a capacitor generated by alternately laminating wirings.

In the formula (1), the capacitance value C increases when the number n of the layers increases, and thus when the number of laminated layers increases, the capacitance value increases as illustrated in FIG. 9.

Further, in the formula (1), the capacitance value C increases when the area A of the wirings alternately laminated increases, and thus when the wiring area increases, the capacitance value increases as illustrated in FIG. 9.

A relationship between a degree of increase in a wiring width with respect to a reference wiring width and a decrease rate of wiring impedance when the wirings are alternately laminated is described with reference to FIG. 10.

When the wiring width is increased with respect to the reference wiring width, a rate of impedance of the increased wiring width with respect to the reference wiring width is determined by a following formula (2).

[Math. 2]

$$R_{dif} = \frac{2\ln\left(\frac{5.98H}{0.8W_2 + T}\right)}{\ln\left(\frac{5.98H}{0.8W_1 + T}\right)} \times 100 \quad (2)$$

In the formula (2), $R_{dif}$ is a rate of impedance of an increased wiring width with respect to a reference wiring width, $\in_r$ is permittivity of a substrate material, $W_1$ is a reference wiring width, $W_2$ is an increased wiring width, T is a thickness of a wiring, and H is a thickness of a dielectric material.

Figure 10:
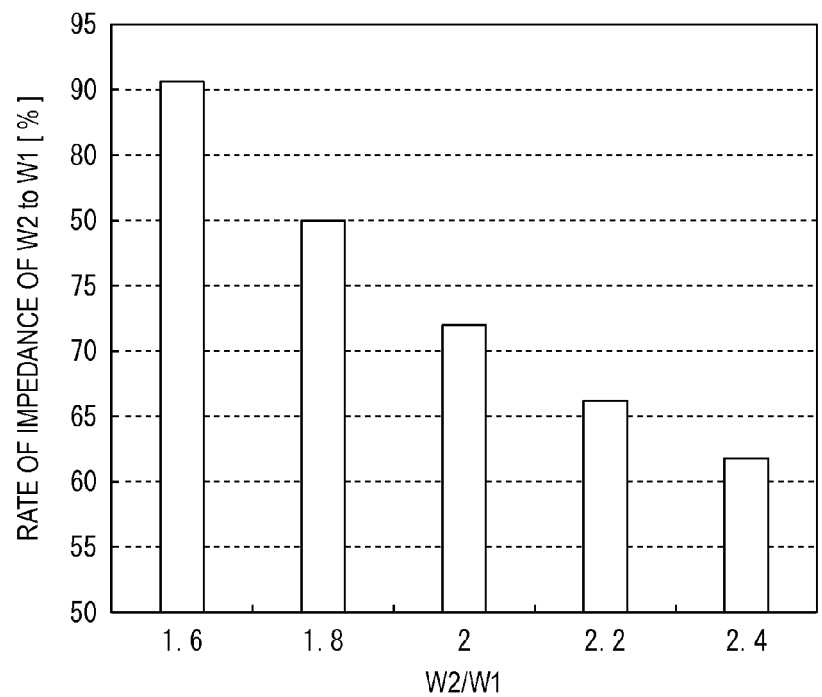
FIG. 10 is a graph illustrating a relationship between a degree of increase in a wiring width with respect to a reference wiring width and a decrease rate of wiring impedance when the wirings are alternately laminated.

As illustrated in FIG. 10, when a ratio of the increased wiring width with respect to the reference wiring width increases, the rate of impedance of the increased wiring width with respect to the reference wiring width decreases. Accordingly, as the wiring width is increased, the wiring impedance decreases.

In the printed circuit substrate 110 and the noise suppression structure 100 according to the present embodiment, the conductive patterns 111, 113, and 115 of the odd numbered layers and the conductive patterns 112, 114, and 116 of the even numbered layers are alternately arranged in the vertical direction in such a manner that the prepreg (insulating layer) 133, the first substrate material (insulating layer) 131, the second prepreg (insulating layer) 134, the second substrate material (insulating layer) 132, and the third prepreg (insulating layer) 135 are held between each layer. Further, the portions excepting the first connecting portions 111b, 113b, and 115b and the second connecting portions 111c, 113c, and 115c which form predetermined areas for connecting the first through-hole 117 and the first notches 111d, 113d, and 115d and the second notches 111e, 113e, and 115e which form predetermined areas for insulating from the second through-hole 118 in the conductive patterns 111, 113, and 115 of the odd numbered layers (portions surrounded by alternate long and short dash lines in FIGS. 7A, 7C, and 7E) have same shapes as the portions excepting the first connecting portions 112b, 114b, and 116b and the second connecting portions 112c, 114c, and 116c which form predetermined areas for connecting the second through-hole 118 and the first notches 112d, 114d, and 116d and the second notches 112e, 114e, and 116e which form predetermined areas for insulating from the first through-hole 117 in the conductive patterns 112, 114, and 116 of the even numbered layers (portions surrounded by alternate long and short dash lines in FIGS. 7B, 7D, and 7F), and the portions are laminated on one another at the same position in the vertical direction. Therefore, the conductive patterns 111, 113, and 115 of the odd numbered layers and the conductive patterns 112, 114, and 116 of the even numbered layers form the capacitor, and the capacitor can reduce the wiring impedance and suppress the noise.

The conductive patterns 111, 113, and 115 of the odd numbered layers and the conductive patterns 112, 114, and 116 of the even numbered layers are alternately arranged in the vertical direction in such a manner that the prepreg (insulating layer) 133, the first substrate material (insulating layer) 131, the second prepreg (insulating layer) 134, the second substrate material (insulating layer) 132, and the third prepreg (insulating layer) 135 are held between each layer, so that an area of the conductive patterns for forming the capacitor on the plane of the substrate can be small, and the constraint on the component layout on the substrate can be minimized. Further, components can be freely arranged on the substrate by changing places to install the first through-hole 117 and the second through-hole 118. Furthermore, when the wiring widths of the conductive patterns 111, 113, and 115 of the odd numbered layers and the conductive patterns 112, 114, and 116 of the even numbered layers laminated in the vertical direction are increased, the wiring impedance can be further reduced, and the noise can be further suppressed.

In addition, the conductive patterns 111, 113, and 115 of the odd numbered layers and the conductive patterns 112, 114, and 116 of the even numbered layers are alternately arranged in the vertical direction, so that, as illustrated in FIG. 6, the conductive patterns do not need to be wired immediately below the common mode filter 120, and a space for mounting other components can be secured immediately below the common mode filter 120.

In the printed circuit substrate 110 and the noise suppression structure 100 according to the present embodiment, as illustrated in FIG. 7A, the first lands 119a connected to the second through-hole 118 are provided to the first notch 111d and the second notch 111e which form the predetermined areas for insulating from the second through-hole 118 on the uppermost layer of the odd numbered layers, namely the first layer. Further, as illustrated in FIG. 7F, the second lands 119b connected to the first through-hole 117 are provided to the first notch 116d and the second notch 116e which form the predetermined areas for insulating from the first through-hole 117 on the lowermost layer of the even numbered layers, namely the sixth layer.

According to the printed circuit substrate 110 and the noise suppression structure 100, the first land 119a provided on the predetermined area for insulating from the second through-hole 118 on the uppermost layer of the odd numbered layers can be connected by solder to a conductor having a predetermined polarity, and the second land 119b provided on the predetermined area for insulating from the first through-hole 117 on the lowermost layer of the even numbered layers can be connected by solder to a conductor having an opposite polarity.

As a width X and a length Y of portions, which have the same shape and are laminated in the vertical direction in the conductive patterns 111, 113, and 115 of the odd numbered layers and the conductive patterns 112, 114, and 115 of the even numbered layers (portions surrounded by alternate long and short dash lines in FIGS. 7A to 7F), become larger, the wiring area increases, and the wiring impedance is effectively decreased.

In addition, it is preferable that a through-hole be not provided in portions between the first connecting portions 111b, 113b, and 115b and the second connecting portions 111c, 113c, and 115c of the conductive patterns 111, 113, and 115 of the odd numbered layers (a portion indicated by Y1 in FIG. 7A) and portions between the first connecting portions 112b, 114b, and 116b and the second connecting portions 112c, 114c, and 116c of the conductive patterns 112, 114, and 116 of the even numbered layers to prevent conductivity from lowering.

Figure 11:
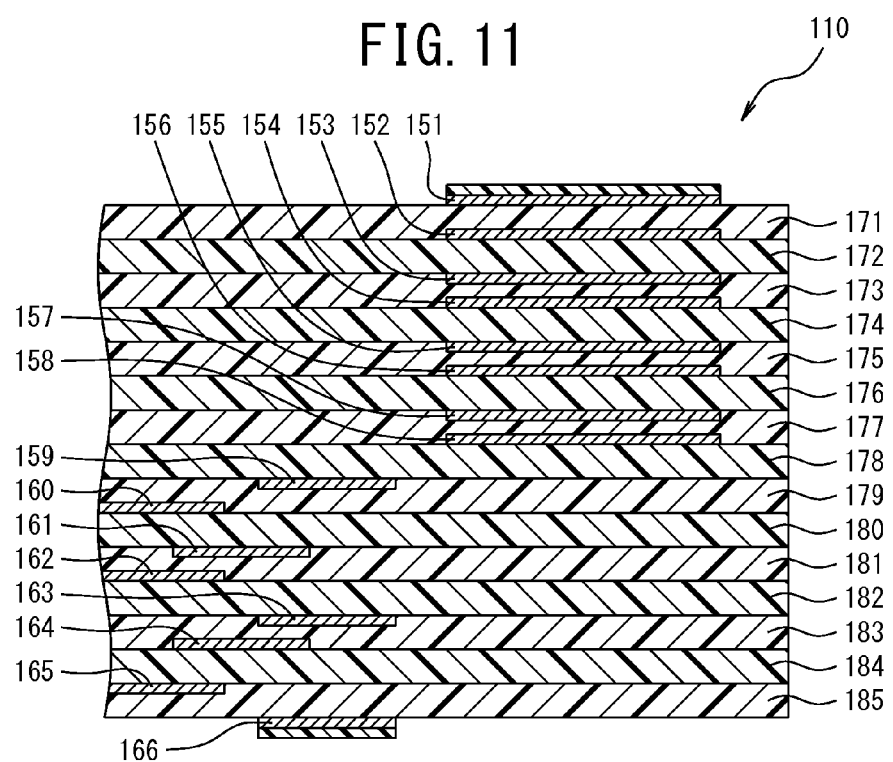
FIG. 11 is a cross-sectional schematic view of a first modification of the printed circuit substrate.
Figure 12:
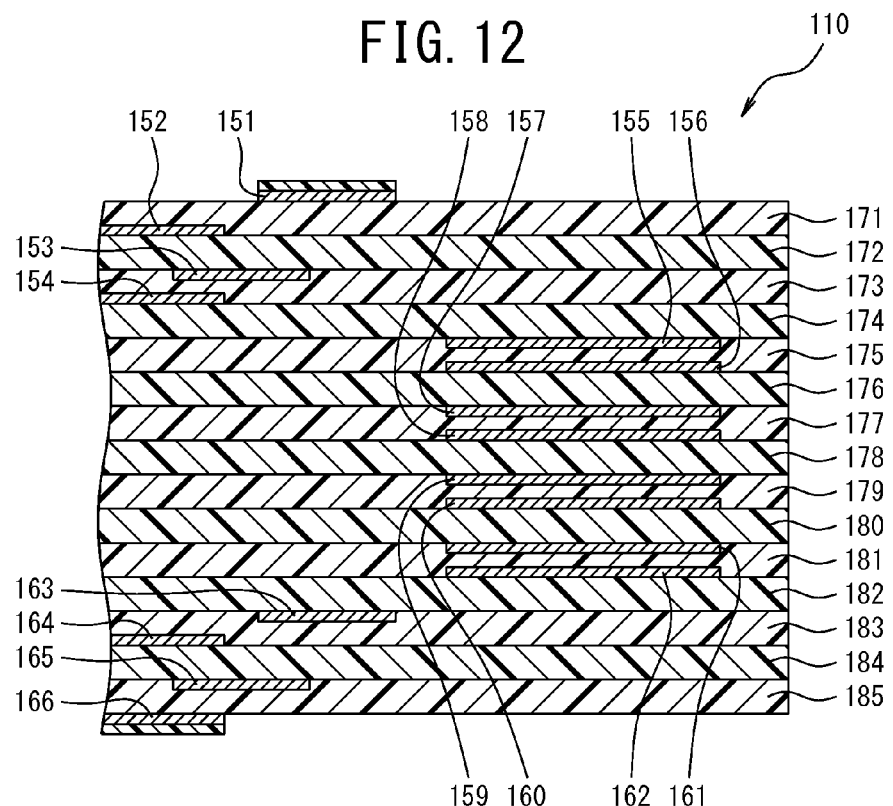
FIG. 12 is a cross-sectional schematic view of a second modification of the printed circuit substrate.
Figure 13:
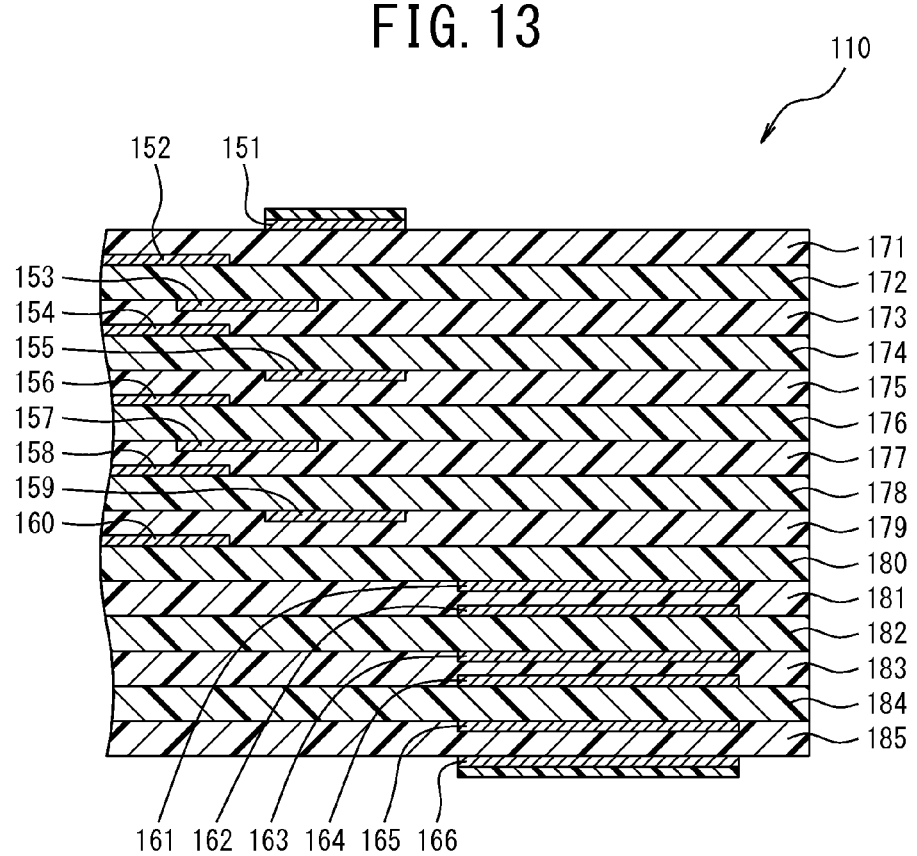
FIG. 13 is a cross-sectional schematic view of a third modification of the printed circuit substrate.
Figure 14:
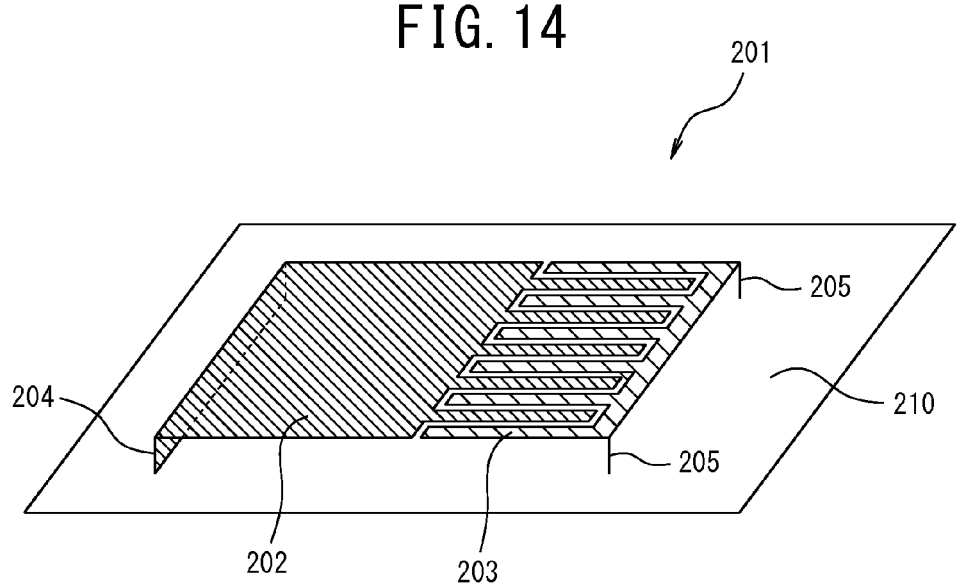
FIG. 14 is a perspective view of a conventional example of a noise suppression structure.

Next, a first modification to a third modification of the printed circuit substrate are respectively described with reference to FIG. 11 to FIG. 13. FIG. 11 is a cross-sectional schematic view of the first modification of the printed circuit substrate. FIG. 12 is a cross-sectional schematic view of the second modification of the printed circuit substrate. FIG. 13 is a cross-sectional schematic view of the third modification of the printed circuit substrate.

The printed circuit substrate 110 illustrated in FIG. 11 is a sixteen-layer substrate including conductive patterns 151 to 166 of a first layer to a sixteenth layer. The conductive patterns 151 to 166 of the first layer to the sixteenth layer are arranged in series while holding insulating layers 171 to 185 between each layer.

The similar configuration as that of the printed circuit substrate 110 illustrated in FIG. 8 is applied to the conductive patterns 151 to 158 of upper eight layers among the conductive patterns 151 to 166 of the first layer to the sixteenth layer.

In other words, in the upper eight layers, the conductive patterns 151, 153, 155, and 157 of the odd numbered layers are mutually connected by the first through-hole (not illustrated), and the conductive patterns 152, 154, 156, and 158 of the even numbered layers are mutually connected by the second through-hole (not illustrated).

Further, in the upper eight layers, portions excepting the predetermined areas for connecting the first through-hole and the predetermined areas for insulating from the second through-hole in the conductive patterns 151, 153, 155, and 157 of the odd numbered layers have the same shape as portions excepting the predetermined areas for connecting the second through-hole and the predetermined areas for insulating from the first through-hole in the conductive patterns 152, 154, 156, and 158 of the even numbered layers, and the portions are laminated on one another at the same position in the vertical direction. Therefore, the conductive patterns 151, 153, 155, and 157 of the odd numbered layers and the conductive patterns 152, 154, 156, and 158 of the even numbered layers form the capacitor, and the capacitor can reduce the wiring impedance and suppress the noise.

Next, the printed circuit substrate 110 illustrated in FIG. 12 is the sixteen-layer substrate including the conductive patterns 151 to 166 of the first layer to the sixteenth layer. The conductive patterns 151 to 166 of the first layer to the sixteenth layer are arranged in series while holding the insulating layers 171 to 185 between each layer.

The similar configuration as that of the printed circuit substrate 110 illustrated in FIG. 8 is applied to the conductive patterns 155 to 162 of intermediate eight layers among the conductive patterns 151 to 166 of the first layer to the sixteenth layer.

In other words, in the intermediate eight layers, the conductive patterns 155, 153, 155, and 157 of the odd numbered layers are mutually connected by the first through-hole (not illustrated), and the conductive patterns 152, 154, 156, and 158 of the even numbered layers are mutually connected by the second through-hole (not illustrated).

Further, in the intermediate eight layers, portions excepting the predetermined areas for connecting the first through-hole and the predetermined areas for insulating from the second through-hole in the conductive patterns 155, 157, 159, and 161 of the odd numbered layers have the same shape as portions excepting the predetermined areas for connecting the second through-hole and the predetermined areas for insulating from the first through-hole in the conductive patterns 156, 158, 160, and 162 of the even numbered layers, and the portions are laminated on one another at the same position in the vertical direction. Therefore, the conductive patterns 155, 157, 159, and 161 of the odd numbered layers and the conductive patterns 156, 158, 160, and 162 of the even numbered layers form the capacitor, and the capacitor can reduce the wiring impedance and suppress the noise.

Further, the printed circuit substrate 110 illustrated in FIG. 13 is the sixteen-layer substrate including the conductive patterns 151 to 166 of the first layer to the sixteenth layer. The conductive patterns 151 to 166 of the first layer to the sixteenth layer are arranged in series while holding the insulating layers 171 to 185 between each layer.

The similar configuration as that of the printed circuit substrate 110 illustrated in FIG. 8 is applied to the conductive patterns 161 to 166 of lower six layers among the conductive patterns 151 to 166 of the first layer to the sixteenth layer.

In other words, in the lower six layers, the conductive patterns 161, 163, and 165 of the odd numbered layers are mutually connected by the first through-hole (not illustrated), and the conductive patterns 162, 164, and 166 of the even numbered layers are mutually connected by the second through-hole (not illustrated).

Further, in the lower six layers, portions excepting the predetermined areas for connecting the first through-hole and the predetermined areas for insulating from the second through-hole in the conductive patterns 161, 163, 165, and 166 of the odd numbered layers have the same shape as portions excepting the predetermined areas for connecting the second through-hole and the predetermined areas for insulating from the first through-hole in the conductive patterns 162, 164, and 166 of the even numbered layers, and the portions are laminated on one another at the same position in the vertical direction. Therefore, the conductive patterns 161, 163, and 165 of the odd numbered layers and the conductive patterns 162, 164, and 166 of the even numbered layers form the capacitor, and the capacitor can reduce the wiring impedance and suppress the noise.

Heretofore, embodiments of the present invention have been described. The present invention, however, is not limited to those embodiments, and various modifications and improvements may occur.

For example, the printed circuit substrate 110 is configured with the six-layer substrate in the example illustrated in FIG. 5 to FIG. 8 and is configured with the sixteen-layer substrate in the example illustrated in FIG. 11 to FIG. 13; however, the printed circuit substrate 110 may be configured with a substrate including two or more layers.

Further, the total number of the conductive patterns of the odd numbered layers and the conductive patterns of the even numbered layer which have the same shape and are laminated on one another at the same position in the vertical direction is not limited to six layers and eight layers and may be an arbitrary number. The wiring impedance can be adjusted by changing the total number of the conductive patterns of the odd numbered layers and the conductive patterns of the even numbered layer which have the same shape and are laminated on one another at the same position in the vertical direction, so that the number of conductive patterns to be laminated may be determined depending on a target noise adjustment value.

In the printed circuit substrate 110, the predetermined area for insulating from the second through-hole 118 is described as the notches 111d, 111e, 113d, 113e, 115d, and 115e formed in the conductive patterns 111, 113, and 115 of the odd numbered layers. However, the predetermined area may be a hole formed in the conductive patterns 111, 113, and 115 of the odd numbered layers.

Further, in the printed circuit substrate 110, the predetermined area for insulating from the first through-hole 117 is described as the notches 112d, 112e, 114d, 114e, 116d, and 116e formed in the conductive patterns 112, 114, and 116 of the even numbered layers. However, the predetermined area may be a hole formed in the conductive patterns 112, 114, and 116 of the even numbered layers.

REFERENCE SIGNS LIST 1 steering wheel 1
2 column shaft
3 speed reducing gear 3
4A, 4B universal joint
5 rack and pinion mechanism
6 tie rod
7 torque sensor
8 electric motor
9 vehicle velocity sensor
10 controller
11 control calculation device
12 gate driving circuit
13 motor driving unit
14 breaker device for emergency stop
15 current detecting circuit
16 rotation sensor
17 rotor position detecting circuit
18 IGN voltage monitor unit
19 power supply circuit unit
20 case
21 semiconductor module placement portion
21a screw hole
22 power/signal connector mounting portion
23 three-phase output connector mounting portion
23a screw hole
24 attaching post
24a screw hole
30 semiconductor module
31 substrate
31a through-hole
32 insulating layer
35 bare-chip FET (bare-chip transistor)
37 surface mounting device
38 attachment screw
39 heat dissipation sheet
40 control circuit substrate
40a through-hole
41 attachment screw
50 power/signal connector
51 attachment screw
60 three-phase output connector
60a through-hole
61 attachment screw
70 cover
81 power supply line
81a positive electrode terminal
82 ground line
82a negative electrode terminal
90 three-phase output portion
91a a-phase output line
91b b-phase output line
91c c-phase output line
100 noise suppression structure
110 printed circuit substrate
111 conductive pattern of first layer
111a pattern main body
111b first connecting portion
111c second connecting portion
111d first notch
111e second notch
111G conductive pattern of first layer
111P conductive pattern of first layer
112 conductive pattern of second layer
112a pattern main body
112b first connecting portion
112c second connecting portion
112d first notch
112e second notch
112G conductive pattern of second layer
112P conductive pattern of second layer
113 conductive pattern of third layer
113a pattern main body
113b first connecting portion
113c second connecting portion
113d second notch
113e second notch
113G conductive pattern of third layer
113P conductive pattern of third layer
114 conductive pattern of fourth layer
114a pattern main body
114b first connecting portion
114c second connecting portion
114d first notch
114e second notch
114G conductive pattern of fourth layer
114P conductive pattern of fourth layer
115 conductive pattern of fifth layer
115a pattern main body
115b first connecting portion
115c second connecting portion
115d first notch
115e second notch
115G conductive pattern of fifth layer
115P conductive pattern of sixth layer
116 conductive pattern of sixth layer
116a pattern main body
116b first connecting portion
116c second connecting portion
116d first notch
116e second notch
116G conductive pattern of sixth layer
116P conductive pattern of sixth layer
117 first through-hole
117a through-hole
117b conductive portion
118 second through-hole
118a through-hole
118b conductive portion
119a first land
119b second land
120 common mode filter
121 filter core
122 coil
123 coil
131 first substrate material
132 second substrate material
133 first prepreg
134 second prepreg
135 third prepreg
136 solder resist
137 solder resist
TH1 through-hole
TH2 through-hole

The invention claimed is:

1. A controlling apparatus for an electric power steering apparatus including a noise suppression structure comprising:
a printed circuit substrate including:
a multilayer substrate including conductive patterns of odd numbered layers and conductive patterns of even numbered layers alternately arranged in a vertical direction; and insulating layers held between the conductive patterns of the odd numbered layers and the conductive patterns of the even numbered layers, respectively; and a common mode filter connected to the printed circuit substrate, wherein the conductive patterns of the odd numbered layers are connected by a plurality of first through-holes communicating in the vertical direction, and the conductive patterns of the even numbered layers are connected by a plurality of second through-holes communicating in the vertical direction, and wherein each of portions excepting first connecting portions and second connecting portions forming predetermined areas for connecting two of the plurality of first through-holes and predetermined areas for insulating from one of the plurality of second through-holes in the conductive patterns of the odd numbered layers has a same shape as each of portions excepting third connecting portions and fourth connecting portions forming predetermined areas for connecting other two of the plurality of second through-holes and predetermined areas for insulating from another of the plurality of first through-holes in the conductive patterns of the even numbered layers, and the portions are laminated one another at a same position in the vertical direction, and there is no through-hole between the first connecting portions and the second connecting portions in the conductive patterns of the odd numbered layers, and there is no through-hole between the third connecting portions and the fourth connecting portions in the conductive patterns of the even numbered layer, and the common mode filter includes a filter core and two coils wound around the filter core, and an end of one of the two coils is connected to a through-hole connecting a plurality of ground patterns with each other, and the other end of the one of two coils is connected to the another of the plurality of first through-holes, and an end of the other of the two coils is connected to the one of the plurality of second through-holes, and the other end of the other of the two coils is connected to a through-hole connecting a plurality of power supply patterns connected to a power supply with each other.

2. The controlling apparatus for the electric power steering apparatus according to claim 1, wherein a first land connected to the one of the plurality of second through-holes is provided on one of the predetermined areas in an uppermost layer of the odd numbered layers for insulating from the one of the plurality of second through-holes, and a second land connected to the another of the plurality of first through-holes is provided on one of the predetermined areas in a lowermost layer of the even numbered layers for insulating from the another of the plurality of first through-holes.

3. The controlling apparatus for the electric power steering apparatus according to claim 1, wherein the predetermined areas for insulating from the one of the plurality of second through-holes are notches formed on the conductive patterns of the odd numbered layers, and the predetermined areas for insulating from the another of the plurality of first through-holes are notches formed on the conductive patterns of the even numbered layers.

4. The controlling apparatus for the electric power steering apparatus according to claim 1, wherein the conductive patterns of the odd numbered layers are connected to a ground line, and the conductive patterns of the even numbered layers are connected to a power supply line.

* * * * *